United States Patent
Suzuki et al.

(10) Patent No.: US 7,733,398 B2
(45) Date of Patent: Jun. 8, 2010

(54) PHOTOELECTRIC CONVERTING FILM STACK TYPE SOLID-STATE IMAGE PICKUP DEVICE

(75) Inventors: Nobuo Suzuki, Miyagi (JP); Kazuyuki Masukane, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 1326 days.

(21) Appl. No.: 11/137,403

(22) Filed: May 26, 2005

(65) Prior Publication Data

US 2005/0264662 A1 Dec. 1, 2005

(30) Foreign Application Priority Data

May 28, 2004 (JP) ............ P.2004-158843

(51) Int. Cl.
*H04N 5/335* (2006.01)
(52) U.S. Cl. ................ 348/296; 348/282
(58) Field of Classification Search ............ 348/315, 348/311, 316, 317, 319, 275, 282
See application file for complete search history.

(56) References Cited

U.S. PATENT DOCUMENTS

| 4,884,143 | A * | 11/1989 | Uya ............ 348/315 |
| 6,236,434 | B1 * | 5/2001 | Yamada ........ 348/315 |
| 2002/0075391 | A1 * | 6/2002 | Shizukuishi ...... 348/319 |
| 2004/0233308 | A1 * | 11/2004 | Elliott et al. ..... 348/265 |

FOREIGN PATENT DOCUMENTS

| JP | 58-103165 | A | 6/1983 |
| JP | 58103165 | * | 6/1983 |
| JP | 64-089363 | | 4/1989 |
| JP | 2002-502120 | A | 1/2002 |
| JP | 2002-83946 | A | 3/2002 |
| JP | 2003-502847 | A | 1/2003 |
| JP | 3405099 | B2 | 3/2003 |

* cited by examiner

*Primary Examiner*—Jason Chan
*Assistant Examiner*—Joel Fosselman
(74) *Attorney, Agent, or Firm*—Birch, Stewart, Kolasch & Birch, LLP

(57) ABSTRACT

A solid-state image pickup device comprises: a semiconductor substrate; at least one photoelectric converting film that generates signal charges corresponding to an amount of incident light; at least one set of pixel electrode films arranged in row and column directions and attached to said at least one photoelectric converting film; vertical transfer paths in the semiconductor substrate, extended in the column direction; and charge accumulating portions in the surface portion of the semiconductor substrate that accumulate signal charges from the pixel electrode films, wherein the charge accumulating portions comprise a plurality of sets, each comprising a subset of the charge accumulating portions arranged in the column direction, and wherein the subset reads out the accumulated signal charges to the corresponding one of the vertical transfer paths, and wherein the two adjacent subsets of the charge accumulating portions are shifted to each other in a direction along the vertical transfer paths.

4 Claims, 3 Drawing Sheets

PHOTOELECTRIC CONVERTING FILM STACK TYPE SOLID-STATE IMAGE PICKUP DEVICE

BACKGROUND OF THE INVENTION

1. Field of the Invention

The present invention relates to a photoelectric converting film stack type solid-state image pickup device in which a photoelectric converting film that generates charges corresponding to the amount of received light is stacked on a semiconductor substrate, and more particularly to a photoelectric converting film stack type solid-state image pickup device in which a signal charge generated in a photoelectric converting film is transferred through a charge transfer path on a semiconductor substrate to be read out to the outside.

2. Description of the Related Art

In a CCD solid-state image pickup device or a CMOS solid-state image pickup device which is mounted on a digital camera, a large number of photoelectric converting elements (photodiodes) serving as light receiving portions, and signal read circuits which read out photoelectric conversion signals obtained in the photoelectric converting elements are formed on the surface of a semiconductor substrate. The signal read circuits are configured by, in the case of a CCD device, charge transfer circuits and transfer electrodes, or by, in the case of a CMOS device, MOS transistor circuits and signal lines.

In the related-art solid-state image pickup device, therefore, many light receiving portions and signal read circuits must be formed on the same surface of a semiconductor substrate, thereby producing a problem in that the area for the light receiving portions cannot be increased.

The related-art single-type solid-state image pickup device has a configuration in which one of color filters of, for example, red (R), green (G), and blue (B) is stacked on each of light receiving portions, so that the light receiving portion detects a light signal of the one color. In the position of a light receiving portion which detects light of, for example, red, therefore, blue and green signals are obtained by interpolating detection signals of surrounding light receiving portions which detect blue light and green light, respectively. This causes a false color, and reduces the resolution. Furthermore, blue light and green light incident on a light receiving portion where a red color filter is formed do not contribute to photoelectric conversion, but are absorbed as heat into the color filter, thereby producing another problem in that the light use efficiency is poor and the sensitivity is low.

As described above, the related-art solid-state image pickup device has various problems. On the other hand, in such a device, the number of pixels is advancing. At present, a large number or several millions of pixels or light receiving portions are integrated on one chip of a semiconductor substrate, and the size of an opening of each of the light receiving portions is near the order of the wavelength. Consequently, a CCD device and a CMOS device are hardly expected to configure an image sensor which can solve the above-discussed problems, and which is superior in image quality and sensitivity than the related-art one.

Therefore, attention is again paid to the structure of a solid-state image pickup device which is disclosed in, for example, JP-A-58-103165. The solid-state image pickup device has a structure where a red-detection photosensitive layer, a green-detection photosensitive layer, and a blue-detection photosensitive layer are stacked by a film growth technique on a semiconductor substrate in which signal read circuits are formed on the surface, these photosensitive layers are used as light receiving portions, and photoelectric conversion signals obtained in the photosensitive layers are supplied to the outside by the signal read circuits. Namely, the solid-state image pickup device has a structure of a photoelectric converting film stack type.

In this structure, it is not required to dispose the light receiving portions on the surface of the semiconductor substrate. Therefore, restrictions on the design of the signal read circuits are largely eliminated, and the light use efficiency of incident light is improved, so that the sensitivity is enhanced. Moreover, one pixel can detect light of the three primary colors or red, green, and blue. Therefore, the resolution is improved, and a false color does not occur. As a result, it is possible to solve the above-discussed problems of the related-art CCD or CMOS solid-state image pickup device.

Recently, photoelectric converting film stack type solid-state image pickup devices disclosed in JP-A-2002-83946, JP-T-2002-502120, JP-T-2003-502847 and Japanese Patent No. 3,405,099 have been proposed. An organic semiconductor or nanoparticles are used as the photosensitive layers.

In a photoelectric converting film stack type solid-state image pickup device in which a signal read circuit is configured by charge transfer paths, photo-charges generated in photoelectric converting films stacked on a semiconductor substrate must be read out to the charge transfer paths to be transferred. FIG. 6 is a surface diagram of vertical transfer paths in a photoelectric converting film stack type solid-state image pickup device disclosed in, for example, JP-A-2002-83946.

The photoelectric converting film stack type solid-state image pickup device has a configuration where one pixel 10 indicated by the broken-line rectangular frame reads out and transfers photo-charges of three colors or red, green, and blue. In the device, therefore, three vertical transfer paths (vertical CCD registers configured by an n-type semiconductor) 11$r$, 11$g$, 11$b$ corresponding to pixels arranged in the row (horizontal) direction are separated by channel stops (p$^+$ regions) 12.

At the same vertical position (first-phase transfer electrode) Φv1 of the vertical transfer paths 11$r$, 11$g$, 11$b$, charge accumulating portions 13$r$, 13$g$, 13$b$ are defined by the channel stops 12 which are formed into a U-like shape. Longitudinal lines upstand at contact portions 14$r$, 14$g$, 14$b$ configured by an n$^+$ region which are disposed at the middles of the charge accumulating portions 13$r$, 13$g$, 13$b$, and are connected to the upper layers or the photoelectric converting films for the respective colors. Signal read gate regions 15$r$, 15$g$, 15$b$ are disposed at the sides (the open end sides of the U-like shapes) of the charge accumulating portions 13$r$, 13$g$, 13$b$.

Subsequent to the first-phase transfer electrode Φv1, a second-phase transfer electrode Φv2, a third-phase transfer electrode Φv3, and a fourth-phase transfer electrode Φv4 are sequentially disposed in the vertical direction of the vertical transfer paths 11$r$, 11$g$, 11$b$. In the next first-phase transfer electrode Φv1, charge accumulating portions (not shown) are disposed in the same manner as described above.

Red signal charges generated in the upper layer or the red photoelectric converting film are accumulated in the charge accumulating portion 13$r$, green signal charges generated in the green photoelectric converting film are accumulated in the charge accumulating portion 13$g$, and blue signal charges generated in the blue photoelectric converting film are accumulated in the charge accumulating portion 13$b$. The charges accumulated in the charge accumulating portions 13$r$, 13$g$, 13$b$ are read out through the read gate regions 15$r$, 15$g$, 15$b$ to the vertical transfer paths 11$r$, 11$g$, 11$b$, and then transferred in the vertical direction by the four-phase drive.

In the photoelectric converting film stack type solid-state image pickup device having the vertical transfer paths shown in FIG. 6, the charge accumulating portions 13r, 13g, 13b for the respective colors are aligned in line at the same vertical position. In the vertical transfer paths 11r, 11g, 11b, therefore, the widths of the vertical transfer paths below the first-phase transfer electrode Φv1 are narrowed, and there arises a trouble that the transfer efficiency is reduced by the narrow-channel effect. As a result, the pixel pitch in the row (horizontal) direction cannot be reduced, and a photoelectric converting film stack type solid-state image pickup device of a high resolution cannot be realized.

The upper limit of the quantity of charges transferred by the vertical transfer paths 11r, 11g, 11b driven by the four-phase drive is determined by a portion where the sum of the areas of two transfer electrodes adjacent in the vertical direction is smallest. In the configuration of FIG. 6, namely, the maximum quantity of transferred charges is determined by the sum of the areas of the second-phase transfer electrode Φv2 or the fourth-phase transfer electrode Φv4, and the first-phase transfer electrode Φv1 having an area which is extremely small. Therefore, the configuration of FIG. 6 has a problem in that the maximum quantity of transferred charges is largely restricted by the first-phase transfer electrode Φv1 and the saturation power is reduced. It is difficult to realize a photoelectric converting film stack type solid-state image pickup device having a wide dynamic range.

SUMMARY OF THE INVENTION

It is an object of the invention to provide a high-resolution photoelectric converting film stack type solid-state image pickup device having a wide dynamic range.

According to the invention, there is provided a photoelectric converting film stack type solid-state image pickup device comprising: a semiconductor substrate; at least one photoelectric converting film that generates signal charges corresponding to an amount of incident light, said at least one photoelectric converting film being above the semiconductor substrate; at least one set of pixel electrode films arranged in row and column directions of said at least one photoelectric converting film and attached to said at least one photoelectric converting film; a plurality of vertical transfer paths in a surface portion of the semiconductor substrate, extended in the column direction; and a plurality of charge accumulating portions that accumulate signal charges from the pixel electrode films, said plurality of charge accumulating portions being in the surface portion of the semiconductor substrate, wherein said plurality of charge accumulating portions comprise a plurality of sets, each comprising a subset of the charge accumulating portions arranged in the column direction, and wherein the subset of the charge accumulating portions reads out the accumulated signal charges to the corresponding one of the vertical transfer paths, and wherein the two adjacent subsets of the charge accumulating portions are shifted to each other in a direction along the vertical transfer paths.

According to the configuration, signal read portions (and charge accumulating portions) of adjacent vertical transfer paths are not aligned at the same vertical position, and the reduction of the widths of the vertical transfer paths which is caused by disposition of the charge accumulating portions can be suppressed. Therefore, the possibility that the vertical transfer paths cause the transfer efficiency reduction because of the narrow-channel effect is decreased, and the pixel pitch can be narrowed in the horizontal direction, so that the resolution can be enhanced. Moreover, the quantity of transferred charges can be maintained to a large level, and hence image data of a wide dynamic range can be obtained.

According to the invention, there is provided the photoelectric converting film stack type solid-state image pickup device, wherein a first arrangement pitch of the pixel electrode films in the row direction is equal to a second arrangement pitch of the pixel electrode films in the column direction.

According to the configuration, the pixel electrode films can be arranged in a close square lattice-like manner, and hence image data are easily stored or displayed.

According to the invention, there is provided the photoelectric converting film stack type solid-state image pickup device, wherein a first arrangement pitch of the pixel electrode films in the row direction and a second arrangement pitch of the pixel electrode films in the column direction are determined so that an arrangement of the charge accumulating portions in the surface portion of the semiconductor substrate is closest.

According to the configuration, the resolution of image data can be improved.

According to the invention, there is provided the photoelectric converting film stack type solid-state image pickup device, wherein said at least one photoelectric converting film comprises: a red-detection photoelectric converting film; a green-detection photoelectric converting film; and a blue-detection photoelectric converting film.

According to the configuration, a color image can be taken.

According to the invention, there is provided the photoelectric converting film stack type solid-state image pickup device, wherein said at least one set of pixel electrode films comprises: a first set of pixel electrode films for red which is attached to the red-detection photoelectric converting film; a second set of pixel electrode films for green which is attached to the green-detection photoelectric converting film; and a third set of pixel electrode films for blue which is attached to the blue-detection photoelectric converting film, wherein the first set of pixel electrode films, the second set of pixel electrode films and the third set of pixel electrode films are aligned with each other in a direction of incident light.

According to the configuration, image data of the three primary colors can be produced by one pixel, and color image data of high quality can be obtained.

According to the invention, there is provided the photoelectric converting film stack type solid-state image pickup device, wherein said at least one set of pixel electrode films comprises: a first set of pixel electrode films for red which is attached to the red-detection photoelectric converting film; a second set of pixel electrode films for green which is attached to the green-detection photoelectric converting film; and a third set of pixel electrode films for blue which is attached to the blue-detection photoelectric converting film, wherein the first set of pixel electrode films, the second set of pixel electrode films and the third set of pixel electrode films are shifted from each other in the row direction by ⅓ of an arrangement pitch of the pixel electrode films.

According to the configuration, even when the dimension of each pixel electrode film in the row direction is larger than that in the column direction, the resolution in the row direction can be enhanced.

DETAILED DESCRIPTION OF THE INVENTION

Hereinafter, embodiments of the invention will be described with reference to the accompanying drawings.

First Embodiment

Figure 1:
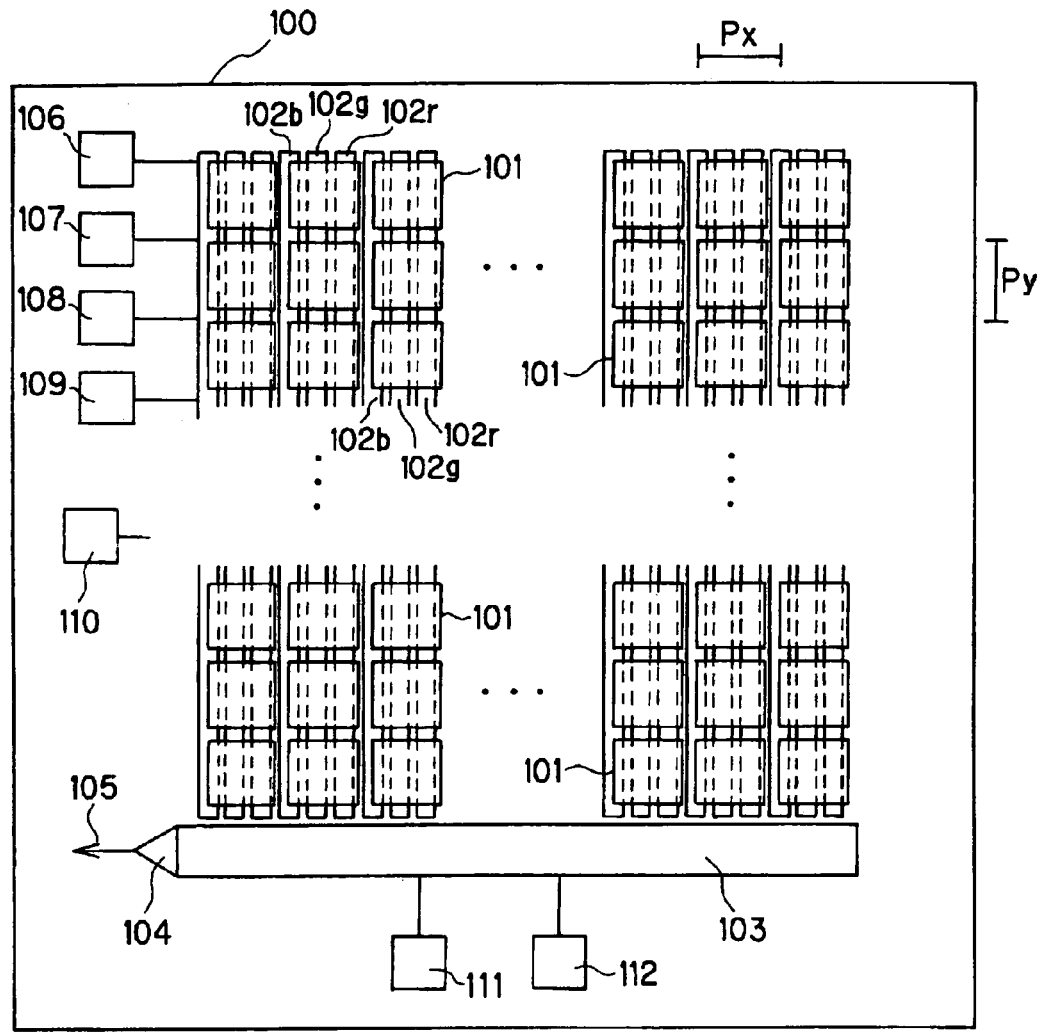
FIG. 1 is a surface diagram of a photoelectric converting film stack type solid-state image pickup device of a first embodiment of the invention.

FIG. 1 is a surface diagram of a photoelectric converting film stack type solid-state image pickup device of a first embodiment of the invention. In the photoelectric converting film stack type solid-state image pickup device 100, many light receiving portions (pixels) 101 are arranged in, in this example, a lattice manner. The light receiving portions 101 are arranged at a pixel pitch Px in the horizontal direction (row direction), and at a pixel pitch Py in the vertical direction (column direction).

On the surface of a semiconductor substrate which is disposed below the light receiving portions 101 of the photoelectric converting film stack type solid-state image pickup device 100, three vertical transfer paths (column CCD registers) 102b, 102g, 102r (the suffixes b, g, r correspond to blue (B), green (G), and red (R), respectively, and the same shall apply hereinafter) are formed in correspondence with the columns of the light receiving portions 101 which are arranged in the column direction, respectively. A horizontal transfer path (row CCD register) 103 is formed in a lower side edge of the semiconductor substrate.

An amplifier 104 is disposed in an exit portion of the horizontal transfer path 103. Signal charges detected in the light receiving portions 101 are first transferred to the horizontal transfer path 103 through the vertical transfer paths 102, and then transferred to the amplifier 104 through the horizontal transfer path 103 to be output as an output signal 105 from the amplifier 104.

On the surface of the semiconductor substrate, electrode terminals 106, 107, 108, 109 connected to four-phase transfer electrodes which are superimposed on the vertical transfer paths 102b, 102g, 102r, and which are not shown are disposed. Four-phase transfer pulses are applied to the electrode terminals. Furthermore, an electrode terminal 110 which is to be connected to a common electrode film that will be described later, and two-phase transfer electrode terminals 111, 112 for the horizontal transfer path 103 are disposed on the surface.

Figure 2:
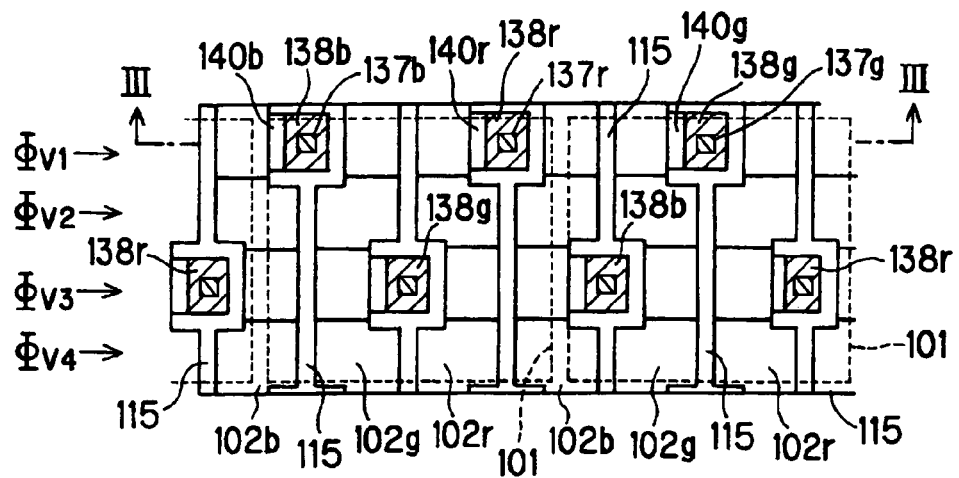
FIG. 2 is a surface diagram of a signal read circuit (CCD) of about two pixels shown in FIG. 1.

FIG. 2 is a surface diagram of the vertical transfer paths in the embodiment, and shows about two light receiving portions 101 or two pixels (more correctly, [2 pixels+⅓ pixel]) which are adjacent in the horizontal direction. Three vertical transfer paths 102r, 102g, 102b disposed below each of the pixel are continuous in the vertical direction, and separated from each other in the horizontal direction by channel stops (p⁺ regions) 115. On the vertical transfer paths 102r, 102g, 102b, for one pixel, four transfer electrodes, or the first-phase transfer electrode Φv1, the second-phase transfer electrode Φv2, the third-phase transfer electrode Φv3, and the fourth-phase transfer electrode Φv4 are sequentially disposed in the vertical direction. In this example, the vertical transfer paths 102r, 102g, 102b perform the charge transfer by means of the four-phase drive.

Figure 6:
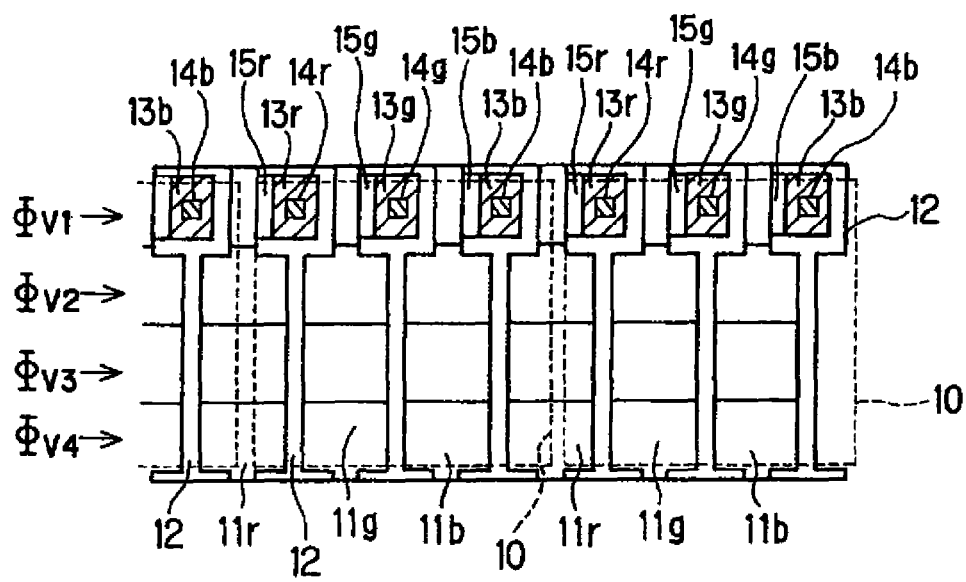
FIG. 6 is a diagram of a signal read circuit (CCD) in the related-art photoelectric converting film stack type solid-state image pickup device.

The photoelectric converting film stack type solid-state image pickup device of the embodiment has a configuration where one pixel detects photo-charges (signal charges) of the three primary colors, or red (R), green (G), and blue (B) in distinction from each other, and the photo-charges of R, G, and B are read out to the corresponding vertical transfer paths 102r, 102g, 102b to be transferred. For one pixel, therefore, three charge accumulating portions 138r, 138g, 138b are disposed in the corresponding vertical transfer paths 102r, 102g, 102b. Unlike the related-art art shown in FIG. 6, the three charge accumulating portions 138r, 138g, 138b are not aligned with each other at the same vertical position.

In the photoelectric converting film stack type solid-state image pickup device of the embodiment, namely, charge accumulating portions of all pixels are arranged in a staggered pattern. In the example shown in FIG. 2, when a certain blue charge accumulating portion 138b is disposed in the portion of the first-phase transfer electrode Φv1 of the vertical transfer path 102b, the red and green charge accumulating portions 138r, 138g formed in the vertical transfer paths 102r, 102g which are laterally adjacent to the vertical transfer path 102b are disposed in the portion of the third-phase transfer electrode Φv3. In adjacent vertical transfer paths, namely, charge accumulating portions are not aligned at the same vertical position of adjacent vertical transfer paths.

The charge accumulating portions 138r, 138g, 138b are defined by the channel stops 115 which are formed into a U-like shape. Longitudinal line connecting portions 137r, 137g, 137b configured by an n⁺ region are disposed in the middles of the charge accumulating portions 138r, 138g, 138b. Signal read gate regions 140r, 140g, 140b are disposed at the sides (the open end sides of the U-like shapes) of the charge accumulating portions 138r, 138g, 138b.

Figure 3:
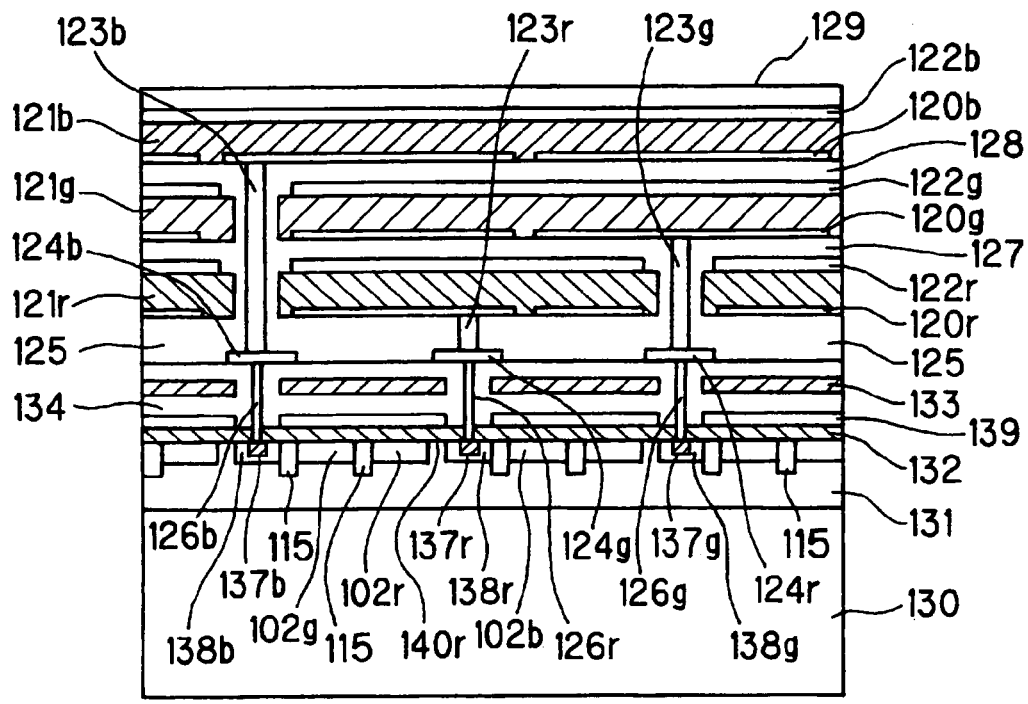
FIG. 3 is a cross-sectional diagram taken along the line III-III in FIG. 2.

FIG. 3 is a cross-sectional diagram taken along the line III-III in FIG. 2. A P-well layer 131 is formed in a surface portion of an n-type semiconductor substrate 130. In a surface portion of the P-well layer 131, the charge accumulating portions 138r, 138g, 138b configured by an n-type region, and the vertical transfer paths (n-type semiconductor layers) 102r, 102g, 102b defined by the channel stops 115 are formed. The longitudinal line connecting portions 137r, 137g, 137b configured by an n⁺ region are formed in middle portions of the charge accumulating portions 138r, 138g, 138b.

A gate insulating film 132 is formed on the surface of the semiconductor substrate 130, a transfer electrode 139 made of polysilicon is formed on the film, and an insulating film 134 is formed on the electrode. A light shielding film 133 is formed in the insulating film 134 so that incident light does not enter the vertical transfer paths.

A conductive film is formed on the insulating film 134, and patterned to form lateral lines 124r, 124g, 124b. The longitudinal line connecting portions 137r, 137g, 137b of the charge accumulating portions 138r, 138g, 138b are connected to the lateral lines 124r, 124g, 124b through first longitudinal lines 126r, 126g, 126b, respectively.

An insulating layer 125 is formed on a layer in which the lateral lines 124r, 124g, 124b are disposed, and a pixel electrode film 120r which is partitioned for each of the light receiving portions 101 is stacked on the insulating layer. A photoelectric converting film 121r for detecting red (R) is stacked on the pixel electrode film 120r. The photoelectric converting film 121r is not required to be partitioned for each of the light receiving portions, and is stacked as a single film over the whole light receiving face which is a collection of the light receiving portions 101.

On the photoelectric converting film 121r, a common electrode film 122r which is common to the light receiving portions 101 for detecting a red signal is stacked similarly as a single film. A transparent insulating film 127 is stacked on the photoelectric converting film.

A pixel electrode film 120g which is partitioned for each of the light receiving portions 101 is stacked on the insulating film 127. On the pixel electrode film, a photoelectric converting film 121g for detecting green (G) is stacked as a single film in the same manner as described above. A common electrode film 122g is stacked on the photoelectric converting film, and a transparent insulating film 128 is stacked on the common electrode film.

A pixel electrode film 120b which is partitioned for each of the light receiving portions 101 is stacked on the insulating film 128. On the pixel electrode film, a photoelectric converting film 121b for detecting blue (B) is stacked as a single film in the same manner as described above. A common electrode film 122b is stacked on the photoelectric converting film, and a transparent protective film 129 is stacked on the common electrode film.

In the embodiment, the pixel electrode films 120b, 120g, 120r for each light receiving portion are aligned in the light incidence direction. Namely, the photoelectric converting film stack type solid-state image pickup device 100 of the embodiment is configured so that one light receiving portion 101 detects the three colors or red (R), green (G), and blue (B).

The lateral line 124b is connected to the blue pixel electrode film 120b through the second longitudinal line 123b, the lateral line 124g is connected to the green pixel electrode film 120g through the second longitudinal line 123g, and the lateral line 124r is connected to the red pixel electrode film 120r through the second longitudinal line 123r. The electrode terminal 110 of FIG. 1 is connected to the common electrode films 122b, 122g, 122r, and a desired bias voltage is applied to the electrode terminal. The longitudinal lines 123r, 123g, 123b, 126r, 126g, 126b are electrically insulted from the other components except the corresponding pixel electrode films, the lateral lines, and the longitudinal line connecting portions.

As the homogeneous and transparent electrode films 122r, 122g, 122b, 120r, 120g, 120b, thin films of tin oxide ($SnO_2$), titanium oxide ($TiO_2$), indium oxide ($InO_2$), or indium tin oxide (ITO) are used. However, the materials of the films are not restricted to these oxides.

The photoelectric converting films 121r, 121g, 121b may be formed by a single-layer film or a multilayer film. As the materials of the films, useful are various materials such as: silicon, a compound semiconductor, and a like inorganic material; an organic material including an organic semiconductor and organic pigment; and a quantum dot deposition film configured by nanoparticles.

When light from an object is incident on the thus configured photoelectric converting film stack type solid-state image pickup device 100, photo-charges corresponding to the amount of blue light of the incident light are generated in the blue photoelectric converting film 121b, and the photo-charges are accumulated in the charge accumulating portion 138b through the longitudinal line 123b, the lateral line 124b, and the longitudinal line 126b. Similarly, photo-charges corresponding to the amount of green incident light are accumulated in the charge accumulating portion 138g, and photo-charges corresponding to the amount of red incident light are accumulated in the charge accumulating portion 138r.

When a read pulse is applied to the first-phase transfer electrode Φv1 and the third-phase transfer electrode Φv3 which are shown in FIG. 2, accumulated charges are read out from the alternate charge accumulating portions 138b, 138r, 138g disposed in the portion of the first-phase transfer electrode Φv1, into potential wells formed below the first-phase transfer electrode Φv1 and the second-phase transfer electrode Φv2. Furthermore, accumulated charges are read out from the alternate charge accumulating portions 138r, 138g, 138b, 138r disposed in the portion of the third-phase transfer electrode Φv3, into potential wells formed below the third-phase transfer electrode Φv3 and the fourth-phase transfer electrode Φv4. Thereafter, the read charges are transferred by the four-phase drive to the horizontal transfer path 103 shown in FIG. 1.

In the embodiment, as shown in FIG. 2, the charge accumulating portions are shifted in the column direction for each column, and arranged in a staggered pattern as a whole. Therefore, the areas of the transfer electrodes (in the illustrated examples, the areas of the first- and third-phase transfer electrodes), which are narrowed in the related-art because of disposition of charge accumulating portions on vertical transfer paths, can be widened. Consequently, the channel widths of the vertical transfer paths can be increased, and the transfer efficiency reduction caused by the narrow-channel effect can be suppressed. Furthermore, the pixels can be miniaturized, and hence the resolution can be enhanced. The maximum quantity of transferred charges can be increased, and therefore image data of a wide dynamic range can be obtained.

Second Embodiment

Figure 4:
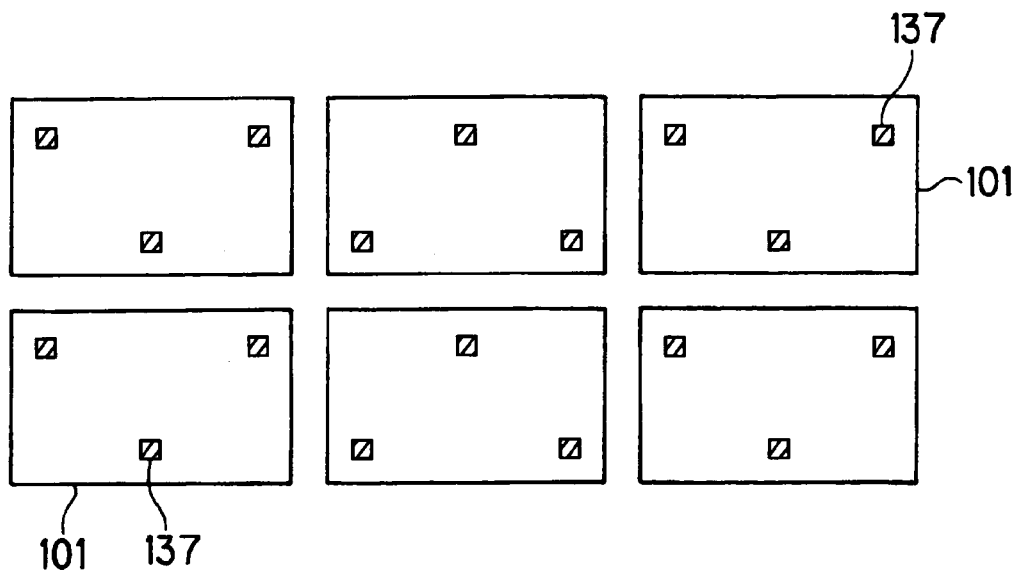
FIG. 4 is a surface diagram of six pixels of a photoelectric converting film stack type solid-state image pickup device of a second embodiment of the invention.

FIG. 4 is a surface diagram of six pixels of a photoelectric converting film stack type solid-state image pickup device of a second embodiment of the invention.

In the photoelectric converting film stack type solid-state image pickup device of the first embodiment shown in FIG. 1, the pixel pitch Px in the horizontal direction is equal to the pixel pitch Py in the vertical direction. Furthermore, four transfer electrodes and three vertical transfer paths are disposed in one pixel. For example, the charge accumulating portion 138g adjacent to the charge accumulating portion 138b shown in FIG. 2 is therefore placed with being shifted with respect to the portion 138b by one-third of the pixel pitch or Px/3 in the horizontal direction, and by one-half of the pixel pitch or Py/2 in the vertical direction.

In the design of the signal read portions for the vertical transfer paths (in the embodiment, the design of the charge accumulating portions because the signal read portions are disposed adjacent to the charge accumulating portions), the degree of integration is maximum when the portions are arranged closest so that, in adjacent vertical transfer paths, the shortest row direction distance between the charge accumulating portions is equal to the shortest column direction distance. FIG. 4 shows an example illustrating this case. In the figure, the rectangular dots 137 indicate longitudinal line connecting portions disposed in the charge accumulating portions. In this case, three vertical transfer paths and four transfer electrodes are disposed in one light receiving portion 101. Therefore, the shape of each light receiving portion (pixel) 101 is not square, and the pixel pitch Px in the horizontal direction and the pixel pitch Py in the vertical direction have the relationship of Px=1.5Py.

The second embodiment has an advantage that the largest number of the pixels 101 can be integrated and hence a high resolution is attained. When an image signal is to be recorded in a memory or displayed, however, it is preferable to arrange the pixels in a square lattice-like manner. In the shape of the laterally elongated pixel 101 such as shown in FIG. 4, the number of image data in the horizontal direction is ⅔ of that of image data in the vertical direction, and is insufficient. In the case where the pixel shape shown in FIG. 4 is employed, therefore, image data in the horizontal direction of the same pitch as the pixel pitch Py in the vertical direction are obtained by interpolation.

Third Embodiment

Figure 5:
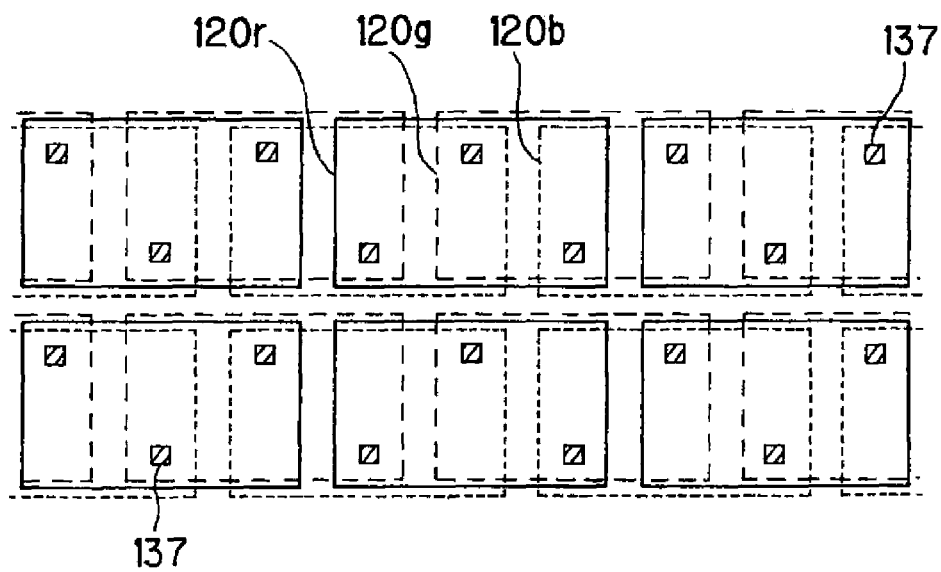
FIG. 5 is a surface diagram of main portions of a photoelectric converting film stack type solid-state image pickup device of a third embodiment of the invention.

FIG. 5 is a surface diagram of main portions of a photoelectric converting film stack type solid-state image pickup device of a third embodiment of the invention.

In the first and second embodiments, the pixel electrode films 120r, 120g, 120b of each pixel 101 are aligned with each other in the direction of incident light. By contrast, the embodiment has the configuration of FIG. 4, or the degree of integration of the CCD signal read portions is largest, and is different in that each of the pixel electrode films 120r, 120g, 120b is shifted by Px/3 in the horizontal direction. According to the configuration, although colors are different, image data which are shifted by Px/3 can be obtained. When the interpolating calculation of image data in the horizontal direction is conducted, the resolution can be enhanced.

In FIG. 5, the pixel electrode films 120r, 120g, 120b are shown with being slightly shifted also in the vertical direction. This is conducted in order to facilitate the viewing of the drawing. Preferably, the ends in the vertical direction of the pixel electrode films 120r, 120g, 120b are disposed in line.

In the embodiments described above, the configuration to which the four-phase drive is applied has been described as an example. However, the invention can be applied also to a configuration where the device is driven in a phase number which is a multiple of 4. When the device is driven by the eight-phase drive, for example, signals of all pixels can be read out by two reading operations. In this case, the quantity of charges which can be transferred by the vertical transfer paths is approximately triplicated, and a large saturation output signal can be obtained.

According to the invention, the pixel pitch can be miniaturized, and therefore a high-resolution image signal can be obtained. Moreover, the quantity of transferred charges can be increased, and hence image data of a wide dynamic range can be obtained.

The photoelectric converting film stack type solid-state image pickup device of the invention can be used as a high-resolution solid-state image pickup device having a wide dynamic range, in place of the related-art CCD or CMOS image sensor. When three photoelectric converting films are disposed, signals of three colors or red, green, and blue can be obtained without using color filters. Therefore, the device is useful when it is mounted on a digital camera.

The entire disclosure of each and every foreign patent application from which the benefit of foreign priority has been claimed in the present application is incorporated herein by reference, as if fully set forth.

What is claimed is:

1. A photoelectric converting film stack type solid-state image pickup device comprising:
a semiconductor substrate;
at least one photoelectric converting film that generates signal charges corresponding to an amount of incident light, said at least one photoelectric converting film being above the semiconductor substrate, and wherein said at least one photoelectric converting film comprises: a red-detection photoelectric converting film; a green-detection photoelectric converting film; and a blue detection photoelectric converting film, the blue detection photoelectric converting film is above the green-detection photoelectric converting film, the green-detection photoelectric converting film is above the red-detection photoelectric converting film;
at least one set of pixel electrode films arranged in row and column directions of said at least one photoelectric converting film and attached to said at least one photoelectric converting film;
a plurality of vertical transfer paths in a surface portion of the semiconductor substrate, extended in the column direction; and
a plurality of charge accumulating portions that accumulate signal charges from the pixel electrode films, said plurality of charge accumulating portions being in the surface portion of the semiconductor substrate,
wherein said plurality of charge accumulating portions comprise a plurality of subsets, each subset comprising at least two of the charge accumulating portions arranged in the column direction, and wherein the subset of the charge accumulating portions reads out the accumulated signal charges to the corresponding one of the vertical transfer paths, and
wherein the two adjacent subsets of the charge accumulating portions are shifted to each other in a direction along the vertical transfer paths,
wherein a first arrangement pitch of the pixel electrode films in the row direction is equal to a second arrangement pitch of the pixel electrode films in the column direction,
wherein said at least one set of pixel electrode films comprises: a first set of pixel electrode films for red which is attached to the red-detection photoelectric converting film; a second set of pixel electrode films for green which is attached to the green-detection photoelectric converting film; and a third set of pixel electrode films for blue which is attached to the blue-detection photoelectric converting film,
wherein the first set of pixel electrode films, the second set of pixel electrode films and the third set of pixel electrode films are shifted from each other in the row direction by ⅓ of an arrangement pitch of the pixel electrode films, and
wherein a first accumulating portion included in one of the subsets of the plurality of charge accumulating portions is apart from a second accumulating portion adjacent to the first accumulating portion included in the same subset by one arrangement pitch of the pixel electrode films in the column in direction.

2. The photoelectric converting film stack type solid-state image pickup device according to claim 1, wherein a first arrangement pitch of the pixel electrode films in the row direction and a second arrangement pitch of the pixel electrode films in the column direction are determined so that an arrangement of the charge accumulating portions in the surface portion of the semiconductor substrate is closest.

3. The photoelectric converting film stack type solid-state image pickup device according to claim 1,
wherein the first set of pixel electrode films, the second set of pixel electrode films and the third set of pixel electrode films are aligned with each other in a direction of incident light.

4. The photoelectric converting film stack type solid-state image pickup device according to claim 1, further comprising:

a plurality of transfer sets, each set having a first-phase transfer electrode, a second-phase transfer electrode, a third-phase transfer electrode and a fourth-phase transfer electrode that transfer the accumulated signal charges by a fourphase drive, wherein a first one of the subsets of the plurality of charge accumulating portions corresponds to the first-phase transfer electrodes, and a second one of the subsets adjacent to the first one of the subsets corresponds to the third-phase transfer electrodes.

* * * * *